Figure 1:
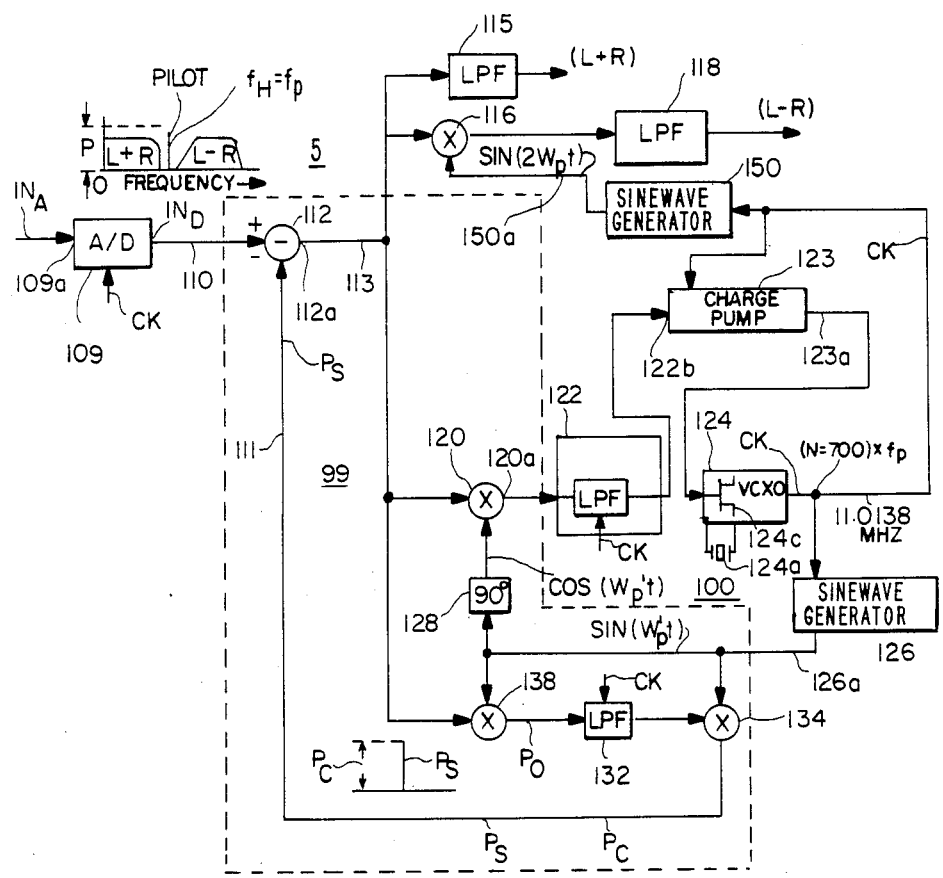

United States Patent [19]

Filliman

[11] Patent Number: 4,817,150
[45] Date of Patent: Mar. 28, 1989

[54] OSCILLATOR FREQUENCY CONTROL ARRANGEMENT FOR A STEREO DECODER

[75] Inventor: Paul D. Filliman, Indianapolis, Ind.

[73] Assignee: RCA Licensing Corporation, Princeton, N.J.

[21] Appl. No.: 91,134

[22] Filed: Aug. 31, 1987

[51] Int. Cl.[4] .............................................. H04H 5/00
[52] U.S. Cl. ............................................. 381/7; 331/20
[58] Field of Search ...................... 331/17, 20, 25, 23; 381/2, 3, 4, 7

[56] References Cited

U.S. PATENT DOCUMENTS

| 4,076,963 | 2/1978 | Fujie et al. | 381/4 |
| 4,398,060 | 8/1983 | Ienaka et al. | 381/4 |
| 4,613,827 | 9/1986 | Takamori et al. | 331/20 |
| 4,686,560 | 8/1987 | Balaban et al. | 358/19 |
| 4,731,844 | 3/1988 | Christopher | 381/13 |

OTHER PUBLICATIONS

U.S. Patent Application No. 091,167, entitled: A Controlled Oscillator, Applicant: P. D. Filliman, Filed: 8/31/87.

Primary Examiner—Forester W. Isen
Attorney, Agent, or Firm—Paul J. Rasmussen; Joseph J. Laks; Sammy S. Henig

[57] ABSTRACT

A charge pump arrangement receives a digital error word representing an error signal and charges or discharges a capacitor in accordance with the sign of the error word by an amount that is proportional to the absolute value of the error word. The voltage produced in the capacitor is coupled to a frequency control terminal of a voltage controlled crystal oscillator that is used in, for example, a stereo decoder.

14 Claims, 2 Drawing Sheets

OSCILLATOR FREQUENCY CONTROL ARRANGEMENT FOR A STEREO DECODER

The invention relates to an arrangement for generating a frequency control signal that is coupled to a controlled oscillator, used in, for example, a stereo decoder of a television apparatus.

Typical baseband composite audio stereo signals include a main signal formed from the sum of the left and right channel signals (L+R), a pilot signal having a frequency $\omega_p$ which is greater than the maximum frequency of the (L+R) signal, and a difference signal (L−R) which is the difference between the left and right channel signals. The difference signal is in the form of a double sideband, amplitude modulated suppressed carrier centered at a frequency of twice $\omega_p$. The pilot signal is essential for demodulating the suppressed carrier to extract the (L−R) audio information.

The demodulated (L−R) signal will nominally include a component corresponding to the pilot signal, and the maximum signal frequency of the (L+R) signal is nominally relatively close to the pilot signal frequency.

In such stereo decoder, a phase-lock-loop circuit (PLL) may b used for generating, for example, a signal at the frequency $2\omega_p$ that is synchronized to the pilot signal and that is used for demodulating the (L−R) signal.

U.S. patent application No. 882,384 entitled, APPARATUS FOR CANCELLING A PILOT SIGNAL FROM A COMPOSITE SIGNAL, in the name of Todd Christopher describes a stereo decoder in which the baseband composite audio stereo signals are sampled for producing a digital signal comprising sequentially provided digital words. A PLL that demodulates the (L−R) signal includes a voltage-controlled crystal oscillator (VCXO). An output signal of the VCXO is at a frequency that is equal, for example, to an integer multiple of the pilot signal. A phase or frequency error signal that is indicative of a corresponding phase or frequency error of the VCXO output signal relative to that of the pilot signal is generated. The frequency error signal in, for example, the Todd arrangement is represented by a digital word.

It may be desirable to generate from the digital frequency error signal, an analog frequency control signal that is to be applied to a frequency control terminal of the VCXO for controlling the frequency and phase of the VCXO output signal.

In carrying out an aspect of the invention, in a stereo decoder apparatus that is responsive to a baseband composite audio signal that includes a pilot signal component a controllable oscillator responsive to a first control signal is included. The oscillator generates an oscillatory signal at a frequency that is controlled in accordance with the first control signal. A phase error indicative signal that forms a digital word having a value that is indicative of a phase difference between the pilot signal component and the oscillatory signal is generated. A first current is coupled to a capacitance for a given interval. A second control signal is generated for varying the duration of the given interval in which the first current is coupled to the capacitance so as to develop the first control signal in the capacitance.

Figure 2:
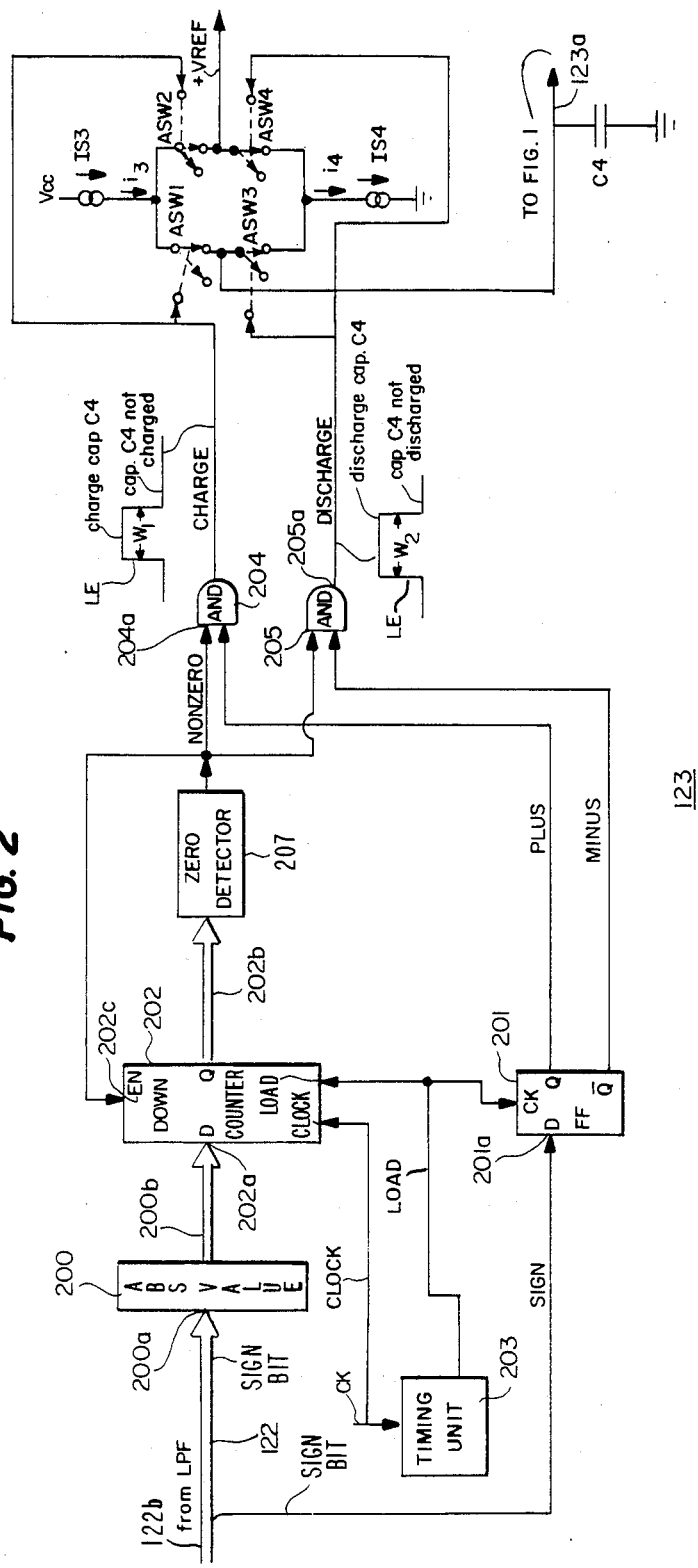

FIG. 1 illustrates a block diagram of a portion of a stereo decoder that includes a charge pump arrangement, embodying an aspect of the invention, for controlling the frequency of a voltage controlled crystal oscillator; and FIG. 2 illustrates a detailed embodiment of the charge pump arrangement of FIG. 1, embodying an aspect of the invention.

In FIG. 1, a composite audio stereo signal $IN_a$ that is obtained from, for example, an FM decoder of a television receiver, not shown in the figures, is coupled to an input terminal 109a of an analog-to-digital converter 109 that generates a composite signal $IN_D$. Signal $IN_D$ is a digital representation of a signal having a frequency composition similar to the spectral waveform 5 that contains a pilot signal component PILOT. Signal component PILOT is, in the BTSC standard, at a frequency $\omega_p$ that is equal to the horizontal scan frequency, $f_H$.

Signal $IN_D$ is applied via a conductor 110 to the minuend input terminal of a signal subtraction circuit 112 of a phase-lock-loop circuit (PLL) 100. A synthesized pilot signal $P_s$ is coupled via connection 111 to the subtrahend input terminal of subtraction circuit 112. Subtraction circuit 112 provides a composite signal 112a, with the pilot signal component substantially eliminated, at its output connection 113. Subtraction circuit 112 is included in a circuit 99 shown within the dashed-line. Circuit 99 performs the analogous function of a phase detector in a conventional PLL.

Signal 112a is also coupled to a low-pass filter 115 which passes, or separates the (L+R) signal to the substantial exclusion of higher frequency components of the composite signal. Since the pilot signal component is not present in the signal applied to filter 115, the frequency cut off characteristics of filter 115 are, advantageously, significantly less critical than if the pilot signal component were present.

Output signal 112a from subtraction circuit 112 is, additionally, coupled to one input of a multiplier circuit 120 that is included in circuit 99. The output developed by the multiplier 120 is coupled to serially coupled circuit elements including a low pass filter 122, a charge pump arrangement 123, embodying an aspect of the invention, a voltage controlled crystal oscillator (VCXO) 124, a sinewave generator circuit 126 and a 90° phase shifter 128.

Low-pass filter 122, of unit 1222 having a cutoff frequency that is substantially lower than that of pilot signal component PILOT, low-pass filters the digital output words at a port 120a of multiplier 120 to produce an error word 122b that is representative of a phase or of a frequency error between signal component PILOT and an output signal CK of VCXO 124, as described later on. Digital error word 122b is then periodically applied every, for example, ⅓ of the period of pilot signal component PILOT, to charge pump arrangement 123, embodying an aspect of the invention, to produce an equivalent analog signal 123a, that remains substantially constant between the above-mentioned periodic application intervals. Signal 123a is coupled to an input terminal of VCXO 124 to establish the output frequency produced thereby.

For a zero average value of the signal at port 120a of multiplier 120, VCXO 124 develops output signal CK having a frequency that is substantially equal to a predetermined integer multiple N of the frequency, $\omega_p$, of pilot signal component PILOT.

Output signal CK from VCXO 124 is applied to sinewave generator 126 which develops a signal 126a that provides a digital representation of a sinusoidal signal, $\sin(\omega_p' t)$, that is in the same frequency and in the same phase as pilot signal component PILOT. Sinewave generator 126 may include, for example, a counter that counts pulses of signal CK and a read-only-memory (ROM), having an address port that is coupled to an output word of the counter, such that signal 126a is produced at an output port of such ROM. Generator 126 establishes the value of integer N that was mentioned before, to be equal, for example, to 700, in accordance with the ratio between the frequency of signal CK and that of signal 126a generated by generator 126. Output signal 126a of sinewave generator 126 is coupled to phase shifter 128 which develops, in a well known manner, a cosine signal of at the same frequency of, but is a phase that is shifted by 90°, which signal corresponds to the expression $\cos(\omega_p' t)$.

Standard FM and BTSC bas composite audio signals, C(t), can be described by the equation $$C(t) = S(t) + P\sin(\omega_p t) + D(t)\sin(2\omega_p t) \quad (1)$$

where C(t) corresponds to signal $IN_D$, and S(t) and D(t) correspond to the time varying (L+R) and (L−R) signals respectively, P is the amplitude, and $\omega_p$ the radian frequency of pilot signal component PILOT.

Synthesized pilot signal $P_s$, applied to subtraction circuit 112, is developed by measuring the amplitude of the residual pilot signal at the output of subtraction circuit 112, effectively amplifying the residual amplitude, and multiplying this value by the output of sinewave generator 126.

Assume that the amplitude, $P_c$, of synthesized pilot signal $P_s$ exactly equals the amplitude P of pilot signal component PILOT. Also, the synthesized pilot signal $P_s$ can be represented as $P_c \sin(\omega_p')$. The value C(t)' obtained from subtraction circuit 112 that is representative of signal 112a may be expressed as $$C'(t) = S(t) + P\sin(\omega_p t) - P_c\sin(\omega_p' t) + D(t)\sin(2\omega_p t). \quad (2)$$

The value C'(t) is multiplier 120 by $\cos(\omega_p' t)$ to yield $$C'(t)\cos(\omega_p' t) = S(t)\cos(\omega_p' t) + P\sin(\omega_p t)\cos(\omega_p' t) - \quad (3)$$

$$P_c\sin(\omega_p' t)\cos(\omega_p' t) + D(t)\sin(2\omega_p t)\cos(\omega_p' t).$$

The first and last terms in equation (3) are sinusoids which will average to zero in the low-pass filter 122. The center two terms, $P\sin(\omega_p t)\cos(\omega_p' t) - P_c\sin(\omega_p' t)\cos(\omega_p' t)$, may be shown, by manipulating trigonometric identities, to be equivalent to $$P/2(\sin(\omega_p t - \omega_p' t) + \sin(\omega_p t + \omega_p' t) - \sin(2\omega_p' t)). \quad (4)$$

The two rightmost terms are relatively high frequency sinusoids and will average to zero in the low-pass filter 122. Since the nominal output frequency of signal 126a of sinewave generator 126 is established close to $\omega_p$, the argument $(\omega_p t - \omega_p' t)$ of the first term of expression (4) will be close to zero. The term $\sin(\omega_p t - \omega_p' t)$ will be a very low frequency sinusoid and will not average to zero unless $\omega_p'$ equals $\omega_p$. Therefore, as long as the frequency $\omega_p'$ is different from the pilot frequency $\omega_p$, multiplier 120 and low-pass filter 122 will periodically vary error signal 122b that is applied to VCXO 124 in a negative feedback manner that will tend to synchronize signal 126a of sinewave generator 126 to pilot signal component PILOT.

Next, consider, for example, that $\omega_p'$ and $\omega_p$ are identical frequencies but that synthesized pilot signal $P_s$ and pilot signal component PILOT are out of phase by $\Delta$ degrees. In this instance, the output of multiplier 120 takes the form $$C'(t)\cos(\omega_p t + \Delta) = S(t)\cos(\omega_p' + \Delta) + P\sin(\omega_p t)\cos(\omega_p t + \quad (5)$$

$$\Delta) - P_c\sin(\omega_p t + \Delta)\cos(\omega_p t + \Delta) + D(t)\sin(2\omega_p t)\cos(\omega_p t + \Delta).$$

The first and fourth terms on the right hand side of equation will average to zero in low-pass filter 122 since they represent sinusoidal signals having frequencies relatively high compared to the reciprocal time constant of the filter. The two middle terms can be shown to be equivalent to $$P/2(\sin(2\omega_p t + \Delta) + \sin\Delta - \sin(2\omega_p t + 2\Delta)). \quad (6)$$

The first and third terms are relatively high frequency sinusoidal signals and will average to zero in low-pass filter 122 of PLL 100. The remaining term, $P/2\sin\Delta$, is substantially a DC term and, thus, will be passed by the low-pass filter 122 to form error signal 122b that provides a phase correction term to VCXO 124. Thus, as long as a frequency or phase error exists, multiplier 120, low-pass filter 122 and charge pump arrangement 123 will vary signal 123a. If no error exists, signal 123a remains constant.

Signal CK is coupled to an input terminal of a sinewave generator 150 that generates a signal 150a that is a digital representation of a sinewave at the radian frequency $2\omega_p$. Sinewave signal 150a is coupled to a multiplicand input port of a multiplier 116. Composite signal $IN_D$, less the synthesized pilot signal $P_s$ obtained from subtraction circuit 112, is coupled to respective multiplicand input terminals of multipliers 116 and 138. Signal 150a from sinewave generator 150, that varies in accordance with the expression $\sin(2\omega_p t)$, is applied to a multiplier input terminal of multiplier 116 to produce the signal (L−R)', described by the equation $$(L - R)' = S(t)\sin(2\omega_p t) + D(t)\sin(2\omega_p t)\sin(2\omega_p t) \quad (7)$$

$$= S(t)\sin(2\omega_p t) + D(t)(1 - \cos^2(2\omega_p t)) \quad (8)$$

which is applied to a low-pass filter 118. Low-pass filter 118 is designed to pass only the baseband term D(t), thus the (L−R) signal is separated.

The output from subtraction circuit 112 is multiplied by the term $\sin(\omega_p t)$ in multiplier 138. Therefore, output signal $P_o$ of multiplier 138 may be expressed as $$P_o = S(t)\sin(\omega_p t) + P\sin(\omega_p t)\sin(\omega_p t) - P_c\sin(\omega_p t)\sin(\omega_p t) + D(t)\sin(2\omega_p t)\sin(\omega_p t). \quad (9)$$

The term $P_c\sin(\omega_p t)\sin(\omega_p t)$ corresponds to the pilot cancelling signal, as described in detail in U.S. patent application Ser. No. 882,384 entitled APPARATUS FOR CANCELLING A PILOT SIGNAL FROM A COMPOSITE SIGNAL, in the name of Todd Christopher and incorporated by reference herein. Signal $P_o$ is applied to a low-pass filter 132 which integrates the signal over a relatively long period compared to $2\pi/\omega_p$. An output signal of filter 132, applied to multiplier 134 is multiplied by signal 126a of generator 126 to generate synthesized pilot signal $P_s$.

FIG. 2 illustrates charge pump arrangement 123 of FIG. 1, embodying an aspect of the invention, in more detail. Similar numbers and symbols in FIGS. 1 and 2 illustrate similar items or functions. Error word or signal 122b of FIG. 1, that is represented, for example, as a 2's complement binary word, is coupled to an input port 200a of an absolute value forming stage 200 that generates a word 200b representing the absolute value of signal 122b. A sign bit of signal 122b is coupled to a data input terminal 201a of a flip-flop 201. Word 200b is coupled to preset input port 202a of a counter 202, operating as a count-down counter. A timing unit 203 generates a signal LOAD that occurs, periodically such as, for example, every interval that is equal to, for example, ⅔ of the period of pilot signal component PILOT of FIG. 1. When signal LOAD of FIG. 2 occurs, signal 200b is stored in counter 202 that causes counter 202 to be preset to the value of signal 200b. Simultaneouly, the sign bit of signal 122b is stored separately in flip-flop 201. As a result of signal LOAD, an output signal 202b of counter 202 is initially equal to signal 200b. Signal 202b is coupled to an input port of a zero detector 207 that generates a signal NONZERO as long as signal 202b is nonzero. Signal NONZERO is coupled to enable terminal 202c of counter 202 that enables counter 202 to count down as long as signal NONZERO is generated. Consequently, counter 202 output signal 202b has a value that decreases sequentially from the initially preset value, each time signal CK generated by VCXO 124 occurs. When counter 202 output signal 202b becomes zero, generation of signal NONZERO ceases and counter 202 ceases counting down until the next time signal LOAD occurs.

Thus, signal NONZERO forms a pulse having a variable width, or duration $W_1$ that is indicative of the absolute value of digital signal 122b. The value of signal 122b is determined in accordance with the weighted value of the bits of each word of signal 122b. Signal NONZERO is coupled to an input terminal 204a of an AND gate 204 that receives a signal PLUS from an output terminal of flip-flop 201. Signal PLUS is generated when signal 122b is positive. Consequently, a variable width output pulse of a signal CHARGE, having the same duration as that of signal NONZERO, is generated when signal 122b is positive. On the other hand, a signal DISCHARGE that is similar to signal CHARGE is generated at an output terminal 205a of an AND gate 205 when signal NONZERO is generated, provided flip-flop 201 generates a signal MINUS that occurs when signal 122b is negative.

In accordance with a feature of the invention, signal CHARGE is coupled to the corresponding control terminals of analog switches ASW1 and ASW2 that causes switch ASW1 to couple a current $i_3$ generated by a current source IS3 to a capacitor C4 as indicated by the solid-line wiper arm positions of switches ASW1 and ASW2. Current $i_3$ causes capacitor C4 to charge only during the pulse duration $W_1$ of signal CHARGE. Source IS3 may be constructed in a conventional manner using MOS technology in a manner not shown in FIG. 2.

In accordance with another feature of the invention, when current $i_3$ is not coupled to capacitor C4, that occurs outside the pulse duration $W_1$, switch ASW2 couples current $i_3$ to voltage +VREF, as indicated by the dashed-line wiper arm positions of switches ASW1 and ASW2. In this way, current source IS3 supplies current $i_3$ continuously that prevents it from saturating or from operating in an undesirable mode of operation. Moreover, since the flow of current $i_3$ is uninterrupted by the switching operation of switch ASW1, current $i_3$ is, advantageously, at the desired level immediately after a leading edge LE of, for example, signal CHARGE occurs.

In a similar manner, signal DISCHARGE is coupled to control terminals of switches ASW3 and ASW4 that operate similarly to switches ASW1 and ASW2, respectively. Switch ASW3, as shown by the dashed line, couples a current $i_4$ produced by a current sink IS4, that is similar to current source IS3, to capacitor C4 for discharging capacitor C4 during a pulse duration $W_2$ of signal DISCHARGE. When switch ASW3 is conductive, switch ASW4 is nonconductive, and vice versa.

Thus, immediately after the generation of signal LOAD, capacitor C4 may be charged, if signal 122b is positive, it may be discharged, if signal 122b is negative or it may remain same if signal 122b is zero. The increase or decrease, respectively, in the level of signal 123a that is developed in capacitor C4 when signal 123 is, for example, positive is proportional to the value of error signal 122b. In this way, frequency control signal 123a is developed by means of the periodic accumulation of error signal 122b, in accordance with the periodic generation of signal LOAD. Frequency control signal 123a is coupled to the frequency control terminal of VCXO 124 of FIG. 1 that generates signal CK at a frequency that is controlled by signal 123a.

An example of a circuit such as VCXO 124 having an MOS input transistor is described in detail in U.S. patent application Ser. No. 091,167, entitled, A CONTROLLED OSCILLATOR in the name of P. D. Filliman, filed concurrently herewith and incorporated by reference herein.

VCXO 124 includes an input stage that is responsive to signal 123a. The input stage includes an MOS transistor 124c having a gate electrode that is coupled to a terminal 124b through which signal 123a is applied to VCXO 124. Because of the high input impedance at the gate of transistor 124c the charge of capacitor C4 of FIG. 2 is substantially maintained the same during each interval that occurs when none of signal CHARGE and DISCHARGE is generated. In this way, the phase of VCXO 124 remains substantially stable when VCXO is phase-locked to pilot component signal PILOT of FIG. 1.

What is claimed:

1. A stereo decoder apparatus responsive to an analog composite signal containing audio information that includes a pilot signal component, comprising:

a controllable oscillator responsive to an analog first control signal, said oscillator generating an oscillatory signal at a frequency that is controlled in accordance with said first control signal;

sampling means responsive to said analog composite signal for sampling said composite signal to generate therefrom a bit weighted sampled signal having a first plurality of bits that represent said composite signal in a numerical, bit weighted form and that contains synchronization information of said pilot signal component;

means responsive to said sampled signal and to said oscillatory signal for generating, a phase error indicative signal that forms a digital word having a second plurality of bits with a numerical bit weighted value that is indicative of a phase difference between said pilot signal component and said oscillatory signal;

a source of a first current;

a capacitance;

a controllable means responsive to a second control signal that is coupled to a control terminal thereof for coupling said first current to said capacitance for a given interval; and means responsive to said second plurality of bits of said phase error indicative signal for generating said second control signal in a manner that varies a length of said given interval in which said first current is coupled to said capacitance so as to develop said analog first control signal in said capacitance.

2. An apparatus according to claim 1 wherein said controllable oscillator includes an FET transistor having a gate electrode thereof coupled to said first control signal such that a high input impedance of said FET transistor prevents a charge in said capacitance from changing outside said given interval.

3. An apparatus according to claim 1 wherein said second control signal generating means comprises a counter that is preset in accordance with a value of said phase error indicative signal, wherein said counter is responsive to a clock signal and counts pulses of said clock signal during said given interval and wherein said second control signal is generated as long as said counter counts said pulses of said clock signal.

4. An apparatus according to claim 1 wherein said second control signal is generated when said phase error indicative signal is at a first polarity and is not generated when said phase error indicative signal is at the opposite polarity.

5. An apparatus according to claim 4 wherein said controllable means that couples said first current to said capacitance comprises a first switch that is conductive when said second control signal is generated.

6. An apparatus according to claim 5 further comprising, means responsive to said phase error indicative signal for generating a third control signal during a second given interval that varies in accordance with said value of said phase error indicative signal such that said third control signal is generated when said phase error indicative signal is at said opposite polarity, and a second switch that is conductive during said second given interval when said third control signal is generated for coupling a source of a second current to said capacitance that changes said first control signal from said capacitance in an opposite manner to that of said first current.

7. An apparatus according to claim 6 further comprising a third switch responsive to said second control signal that is conductive when said first switch is nonconductive, and vice versa, for forming an alternate current path to said first current when said first switch is nonconductive.

8. An apparatus according to claim 7 wherein said third switch causes the flow of said first current to be substantially uninterrupted when said first switch changes from being conductive to being nonconductive and from being nonconductive to being conductive.

9. An apparatus according to claim 1 wherein said second control signal has a pulse duration that determines said length of said given interval when said first current is coupled to said capacitance.

10. An apparatus according to claim 1 wherein said second control signal is generated only when a phase difference between said pilot signal component and said oscillatory signal is at a first polarity.

11. An apparatus according to claim 1 wherein said controllable means comprises, means for generating a second phase error indicative signal forming a digital word having a value that is equal to an absolute value of said first phase error indicative signal for controlling the length of said given interval in accordance with said absolute value.

12. An apparatus according to claim 1 further comprising, a source of a second current, wherein said controllable means couples said first current to said capacitance when said phase difference is at a first polarity and couples said second current to said capacitance when said phase difference is at the opposite polarity such that, during a given phase detection cycle, as long as said phase difference is at said first polarity, said second current is decoupled from said capacitance and, as long as said phase difference is at the opposite polarity, said first current is decoupled from said capacitance.

13. A phase-lock-loop circuit responsive to a synchronizing input signal, of a television signal comprising;

a controllable oscillator responsive to an analog, first control signal, said oscillator generating an oscillatory signal at a frequency that is controlled in accordance with said first control signal;

sampling means responsive to said input signal for sampling said television signal to generate therefrom a bit weighted sampled signal having a first plurality of bits that represent said input signal in a numerical, bit weighted form;

means responsive to said sampled signal and to said oscillatory signal for generating a sequence of digital, phase error indicative words, each word having a value that is indicative of a phase difference between said synchronizing input signal and said oscillatory signal;

means responsive to said sequence of digital phase error indicative words for generating a pulse having a pulse width that varies in accordance with said value;

a source of a first current;

a capacitance; and controllable means responsive to said pulse for coupling said first current to said capacitance for a given interval having a duration that is in accordance with said pulse width to generate said analog first control signal thereby enabling said oscillatory signal to be synchronized to said input signal.

14. An apparatus according to claim 13 wherein said phase error indicative word generating means generates said sequence of words at a rate that is in accordance with said frequency of said oscillatory signal.

* * * * *